(12) United States Patent
Park

(10) Patent No.: US 8,067,289 B2
(45) Date of Patent: Nov. 29, 2011

(54) SEMICONDUCTOR DEVICE AND MANUFACTURING METHOD THEREOF

(75) Inventor: Il-Yong Park, Seo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/629,543

(22) Filed: Dec. 2, 2009

(65) Prior Publication Data

US 2010/0140702 A1    Jun. 10, 2010

(30) Foreign Application Priority Data

Dec. 5, 2008  (KR) ................ 10-2008-0123168

(51) Int. Cl.
    *H01L 21/336* (2006.01)
(52) U.S. Cl. ........ 438/291; 438/135; 438/136; 438/137; 438/197; 257/296; 257/297; 257/298; 257/299
(58) Field of Classification Search .......... 438/286–291; 257/296–304, 335–341, 401–409, E29.256, 257/E21.417, E29.012
    See application file for complete search history.

(56) References Cited

U.S. PATENT DOCUMENTS

| | | | | |
|---|---|---|---|---|
| 5,406,110 A * | 4/1995 | Kwon et al. | .............. | 257/493 |
| 5,422,508 A * | 6/1995 | Yilmaz et al. | .............. | 257/370 |
| 5,541,444 A * | 7/1996 | Ohmi et al. | .............. | 257/587 |
| 5,569,937 A * | 10/1996 | Bhatnagar et al. | .............. | 257/77 |
| 5,627,385 A * | 5/1997 | Bhatnagar et al. | .............. | 257/77 |
| 5,801,078 A * | 9/1998 | Jimenez | .............. | 438/306 |
| 5,869,850 A * | 2/1999 | Endo et al. | .............. | 257/139 |
| 5,869,875 A * | 2/1999 | Hebert | .............. | 257/382 |
| 5,903,032 A * | 5/1999 | Duvvury | .............. | 257/356 |
| 6,117,738 A * | 9/2000 | Tung | .............. | 438/286 |
| 6,160,290 A * | 12/2000 | Pendharkar et al. | .......... | 257/339 |
| 6,215,152 B1* | 4/2001 | Hebert | .............. | 257/340 |
| 6,228,719 B1* | 5/2001 | Frisina et al. | .............. | 438/268 |
| 6,265,752 B1* | 7/2001 | Liu et al. | .............. | 257/487 |
| 6,310,378 B1* | 10/2001 | Letavic et al. | .............. | 257/347 |
| 6,380,566 B1* | 4/2002 | Matsudai et al. | .............. | 257/175 |
| 6,399,468 B2* | 6/2002 | Nishibe et al. | .............. | 438/592 |
| 6,424,005 B1* | 7/2002 | Tsai et al. | .............. | 257/335 |
| 6,448,625 B1* | 9/2002 | Hossain et al. | .............. | 257/493 |
| 6,483,149 B1* | 11/2002 | Mosher et al. | .............. | 257/356 |
| 6,521,920 B2* | 2/2003 | Abe | .............. | 257/223 |
| 6,521,946 B2* | 2/2003 | Mosher | .............. | 257/336 |
| 6,548,874 B1* | 4/2003 | Morton et al. | .............. | 257/371 |
| 6,559,504 B2* | 5/2003 | Nishibe et al. | .............. | 257/343 |
| 6,617,643 B1* | 9/2003 | Goodwin-Johansson | .... | 257/335 |
| 6,620,697 B1* | 9/2003 | Alok et al. | .............. | 438/301 |
| 6,670,685 B2* | 12/2003 | Pendharkar | .............. | 257/409 |

(Continued)

*Primary Examiner* — N Drew Richards
*Assistant Examiner* — Ankush Singal
(74) *Attorney, Agent, or Firm* — Sherr & Vaughn, PLLC

(57) ABSTRACT

A semiconductor device and a method of manufacturing a semiconductor device. A semiconductor device may include an epitaxial layer over a semiconductor substrate, a first well region over a epitaxial layer, a first isolation layer and/or a third isolation layer at opposite sides of said first well region and/or a second isolation layer over a first well region between first and third isolation layers. A semiconductor device may include a gate over a second isolation layer. A semiconductor device may include a second well region over a first well region between a third isolation layer and a gate, a first ion-implanted region over a second well region between a third isolation layer and a gate, and/or a second ion-implanted region between a first ion-implanted region and a gate. A semiconductor device may include an accumulation channel between a second well region and a gate.

11 Claims, 3 Drawing Sheets

U.S. PATENT DOCUMENTS

| | | | |
|---|---|---|---|
| 6,713,794 B2 * | 3/2004 | Suzuki | 257/288 |
| 6,727,127 B1 * | 4/2004 | Darmawan et al. | 438/197 |
| 6,773,997 B2 * | 8/2004 | Imam et al. | 438/286 |
| 6,876,035 B2 * | 4/2005 | Abadeer et al. | 257/343 |
| 6,946,705 B2 * | 9/2005 | Kitaguchi | 257/335 |
| 6,995,428 B2 * | 2/2006 | Huang et al. | 257/345 |
| 7,148,540 B2 * | 12/2006 | Shibib et al. | 257/336 |
| 7,173,308 B2 * | 2/2007 | Kitaguchi | 257/342 |
| 7,192,834 B2 * | 3/2007 | Hsu et al. | 438/268 |
| 7,268,046 B2 * | 9/2007 | Letavic et al. | 438/287 |
| 7,473,978 B2 * | 1/2009 | Matsudai et al. | 257/492 |
| 7,498,652 B2 * | 3/2009 | Pan et al. | 257/492 |
| 7,554,154 B2 * | 6/2009 | Hebert | 257/340 |
| 7,602,037 B2 * | 10/2009 | Lin et al. | 257/492 |
| 7,821,062 B2 * | 10/2010 | Gossner | 257/335 |
| 2002/0063266 A1 * | 5/2002 | Lee | 257/200 |
| 2002/0117714 A1 * | 8/2002 | Hebert | 257/339 |
| 2004/0238913 A1 * | 12/2004 | Kwon et al. | 257/492 |
| 2006/0001084 A1 * | 1/2006 | Kelly et al. | 257/329 |
| 2006/0043479 A1 * | 3/2006 | Parris et al. | 257/341 |
| 2007/0080398 A1 * | 4/2007 | Lee et al. | 257/340 |
| 2008/0023785 A1 * | 1/2008 | Hebert | 257/492 |
| 2008/0290410 A1 * | 11/2008 | Huang et al. | 257/343 |
| 2010/0173458 A1 * | 7/2010 | You et al. | 438/200 |

* cited by examiner

SEMICONDUCTOR DEVICE AND MANUFACTURING METHOD THEREOF

The present application claims priority under 35 U.S.C. 119 to Korean Patent Application No. 10-2008-0123168 (filed on Dec. 5, 2008) which is hereby incorporated by reference in its entirety.

BACKGROUND

Embodiments relate to a semiconductor device and a method of manufacturing a semiconductor device.

Semiconductor devices may be used in various technologies, including switching mode power supplies, lamp stabilization and/or motor driving circuits. A depletion type MOSFET (DMOSFET) using a planar diffusion technology, for example a laterally diffused metal oxide semiconductor (LDMOS) transistor, may be developed. A lateral double diffused metal oxide semiconductor (LDMOS) may be a majority carrier device and/or a lateral power device which may have relatively rapid switching response and/or relatively high input impedance. Example FIG. 1 is a sectional view illustrating an LDMOS device.

Figure 1:
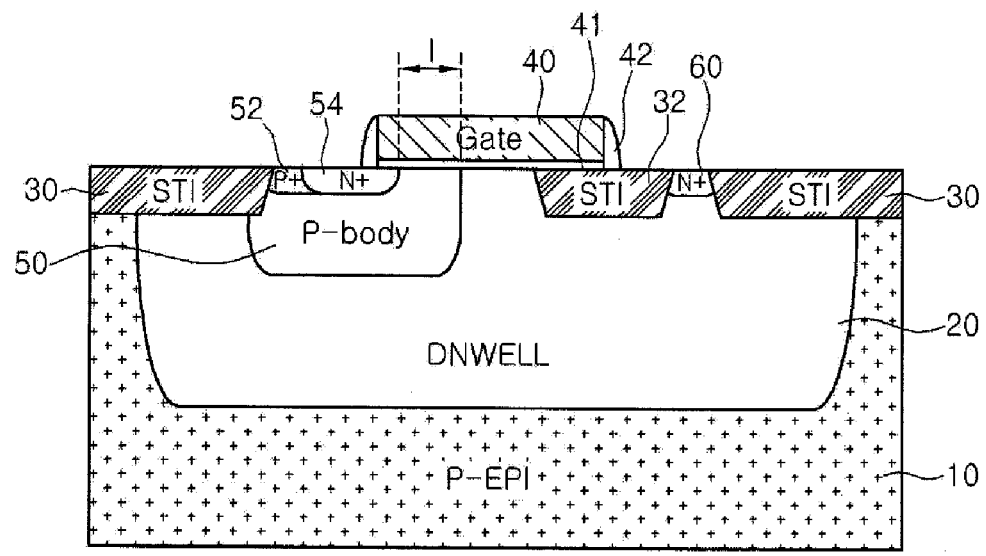

Referring to FIG. 1, an LDMOS device may include P-type epitaxial layer 10 on and/or over a semiconductor device, deep n well (DNWELL) 20, gate dielectric 41, gate 40, spacer 42, P-body 50, isolation layer 30 which may define a semiconductor region and/or drain expansion isolation layer 32. An LDMOS device may include ion-implanted region 52 of a first conductivity type on and/or over P-body 50 at one side of gate 40, first ion-implanted region 54 of a second conductivity type between ion-implanted region 52 of a first conductivity type and gate 40 and/or a second ion-implanted region 60 of a second conductivity type at a side of drain expansion isolation layer 32. Drain expansion isolation layer 32 may be a layer formed by expanding a portion of gate dielectric 41. A current may flow from first ion-implanted region 54 of a second conductivity type, for example a source region, through a surface of drain expansion isolation layer 32 to second ion-implanted region 60 of a second conductivity type, for example a drain region.

An LDMOS device may be used as a switching device, and/or a channel length 1 of an LDMOS device may be relatively shortly formed to drive a relatively large amount of a current. An LDMOS device may be designed such that a doping concentration of P-body 50 is high enough to protect from a relatively high voltage, to prevent a punch-through breakdown phenomenon when a reverse bias may be applied. However, current may flow through an inversion layer formed on and/or over a surface of P-body 50, under the gate 40, when a voltage may be applied. Electron mobility of an inversion layer may be relatively lower than a bulk region of a semiconductor substrate, on-resistance which may be a main parameter of an LDMOS device may be maximized, and/or current drivability may be minimized.

Accordingly, there is a need for a semiconductor device and a method of manufacturing a semiconductor device which may have an accumulation channel structure, in contrast to a channel structure in which a current flows through an inversion layer formed on and/or over a surface of a P-body when a voltage may be applied.

SUMMARY

Embodiments relate to a semiconductor device and a method of manufacturing a semiconductor device. According to embodiments, a semiconductor device may include an accumulation channel structure, in contrast to a channel structure in which a current flows through an inversion layer formed on and/or over a surface of a P-body when a voltage may be applied.

According to embodiments, a semiconductor device may include an epitaxial layer on and/or over a semiconductor substrate. In embodiments, a semiconductor device may include a first well region at a portion of an upper side of an epitaxial layer. In embodiments, a semiconductor device may include a first isolation layer and/or a third isolation layer at right and/or left sides of a first well region. In embodiments, a semiconductor device may include a second isolation layer at a middle of a first well region. In embodiments, a semiconductor device may include a gate at a portion of a first well region between a second isolation layer and a third isolation layer and/or on and/or over a portion of the second isolation layer. In embodiments, a semiconductor device may include a second well region on and/or over a first well region, which may extend from a third isolation layer to a portion of a gate.

According to embodiments, a semiconductor device may include a first ion-implanted region on and/or over a second well region, which may extend from a third isolation layer to a gate. In embodiments, a semiconductor device may include a second ion-implanted region at a portion of a first ion-implanted region adjacent to a gate. In embodiments, a semiconductor device may include an accumulation channel on and/or over a second well region, which may be under a gate where a second ion-implanted region may not be formed.

According to embodiments, a method of manufacturing a semiconductor device may include forming an epitaxial layer on and/or over a semiconductor substrate. In embodiments, a method of manufacturing a semiconductor device may include forming a first well region at a portion of an upper side of an epitaxial layer. In embodiments, a method of manufacturing a semiconductor device may include forming a first isolation layer and/or a third isolation layer at right and/or left sides of a first well region. In embodiments, a method of manufacturing a semiconductor device may include forming a second isolation layer at a middle of a first well region. In embodiments, a method of manufacturing a semiconductor device may include forming a second well region at a portion of a first well region between a third isolation layer and/or a second isolation layer. In embodiments, a method of manufacturing a semiconductor device may include forming a first ion-implanted region at a portion of an upper side of a second well region.

According to embodiments, a method of manufacturing a semiconductor device may include forming a second ion-implanted region at an end of a first ion-implanted region adjacent to a second isolation layer. In embodiments, a method of manufacturing a semiconductor device may include forming a third ion-implanted region between a second isolation region and a third isolation region. In embodiments, a method of manufacturing a semiconductor device may include diffusing a second well region, where a second ion-implanted region may not be formed, to a first well, where a gate may be formed, for example through a thermal treatment. In embodiments, a method of manufacturing a semiconductor device may include forming an accumulation channel on and/or over a second well region diffused to a first well region where a gate may be formed.

DRAWINGS

Example FIG. 1 is a sectional view illustrating a structure of a laterally diffused metal oxide semiconductor device.

Figure 2:
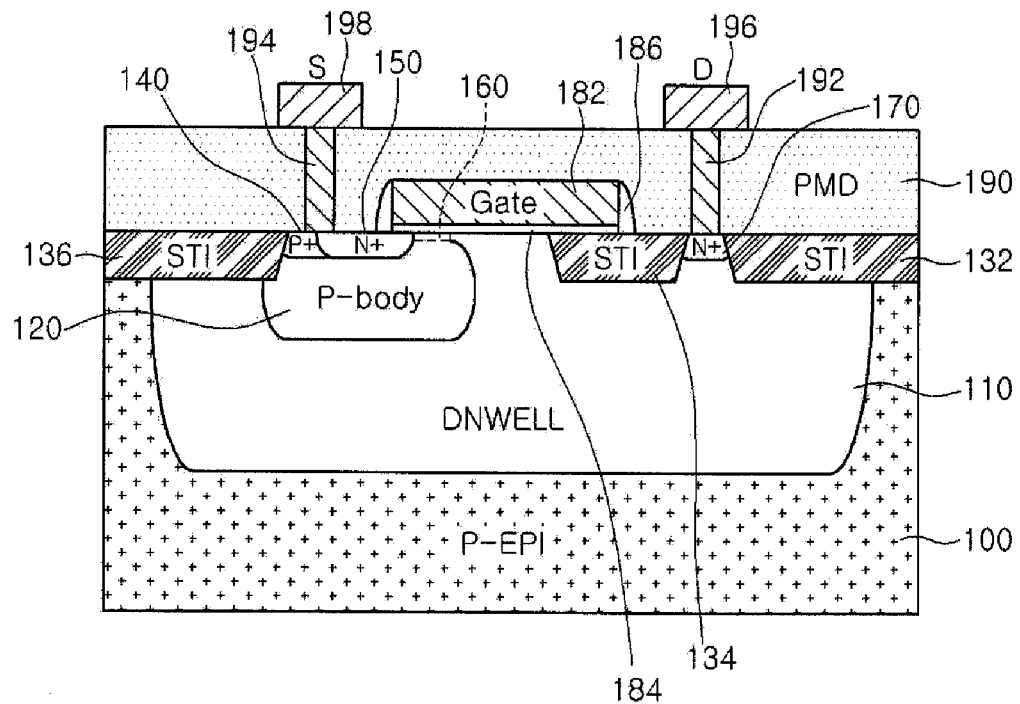

Example FIG. 2 is a sectional view illustrating a structure of a semiconductor device in accordance with embodiments.

Figure 3:
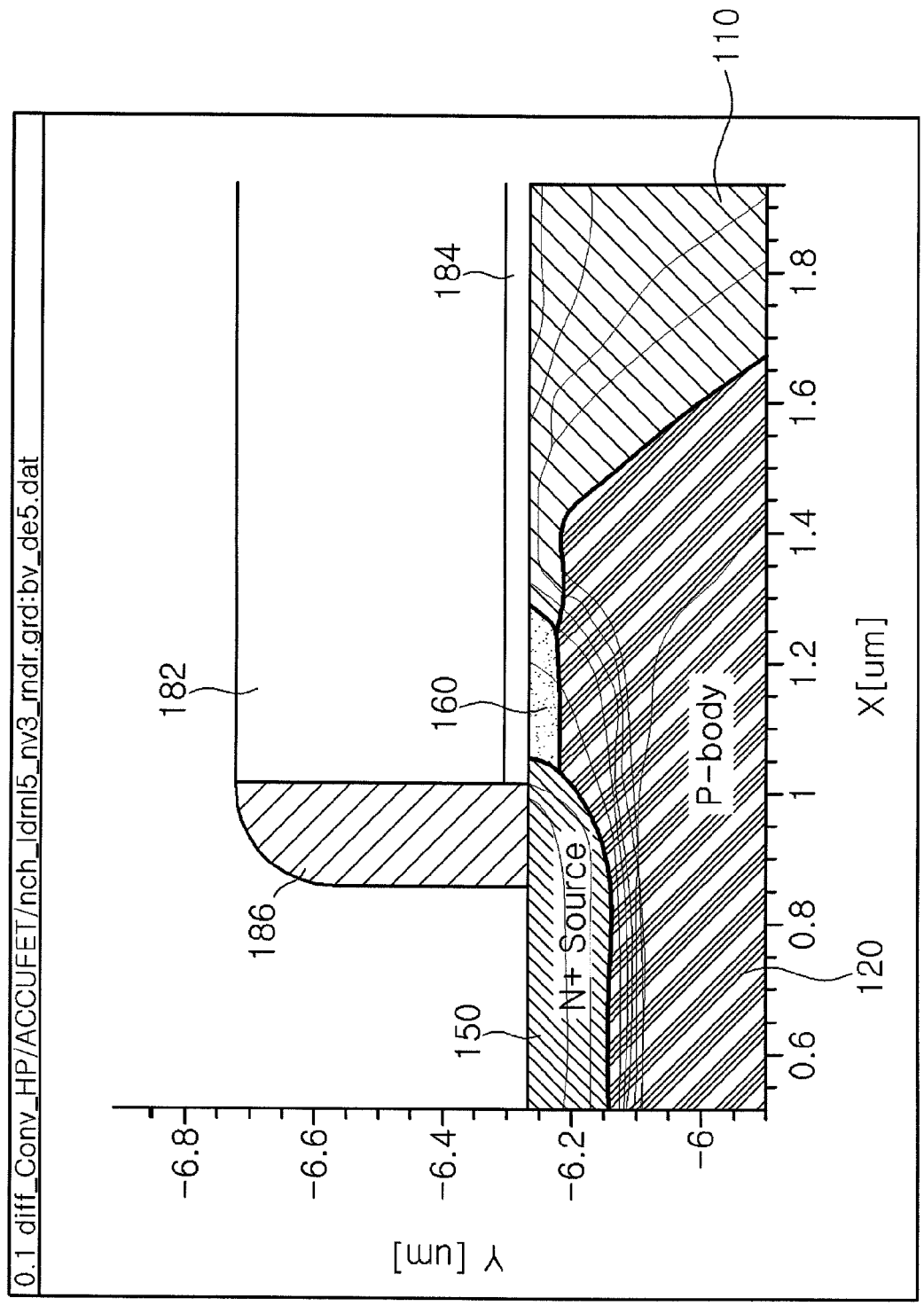

Example FIG. 3 illustrates an operation of a semiconductor device in accordance with embodiments.

Figure 4:
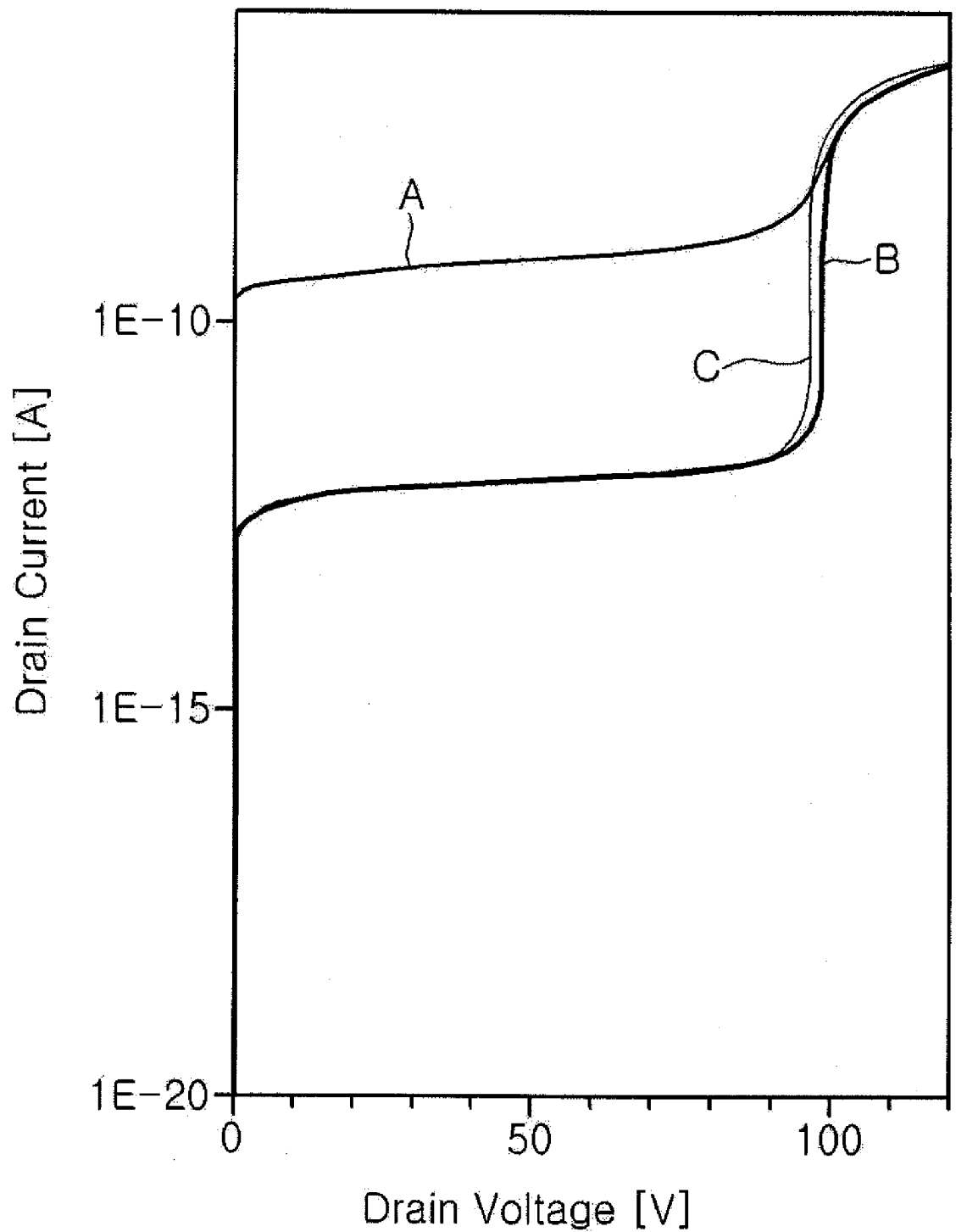

Example FIG. 4 is a graph illustrating breakdown voltage characteristics of a semiconductor device using an inversion layer and a semiconductor device in accordance with embodiments.

DESCRIPTION

Embodiments relate to a semiconductor device and a method of manufacturing a semiconductor device. Referring to example FIG. 2, a side view illustrates a structure of a semiconductor device in accordance with embodiments. According to embodiments, a semiconductor device may include an laterally diffused metal oxide semiconductor device (LDMOS) device.

According to embodiments, epitaxial layer 100 may be formed on and/or over a semiconductor substrate. In embodiments, a semiconductor substrate may include a single-crystalline silicon substrate. In embodiments, first well region 110 may be formed at a portion of an upper side of epitaxial layer 100. In embodiments, epitaxial layer 100 may be an epitaxial layer of a first conductivity type, for example a P-type epitaxial layer. In embodiments, first well region 110 may be a well of a second conductivity type, for example a deep n well (DNWELL).

According to embodiments, a photoresist may be coated on and/or over epitaxial layer 100. In embodiments, a photoresist pattern may be formed through a reticle alignment, an exposure process and/or a development process. In embodiments, an upper portion of a semiconductor substrate may be partially etched using a photoresist pattern as an etch mask to form a plurality of trenches. In embodiments, a photoresist pattern may be removed. In embodiments, an insulation layer may be formed on and/or over a semiconductor substrate to fill trenches. In embodiments, an insulation layer may be planarized through a chemical mechanical polishing (CMP) process, or the like, to form isolation layers 132, 134 and/or 136.

According to embodiments, first isolation layer 132 and/or third isolation layer 136 may be formed at right and/or left sides of first well region 110, and may be isolation layers defining semiconductor regions. In embodiments, second isolation layer 134 may be formed at a middle of first well region 110 and may be a drain expansion isolation layer. In embodiments, a photoresist pattern may be formed to open a portion of first well region 110 adjacent to third isolation layer 136 on and/or over a region between third isolation layer 136 and second isolation layer 134, and/or first well region 110 between first isolation layer 132 and second isolation layer 134. In embodiments, an ion implantation process may be performed using a photoresist pattern as an ion implantation mask.

According to embodiments, second well region 120 may be formed at a portion of an upper side of first well 110 adjacent to third isolation layer 136, for example by implanting ions of a first conductivity type. In embodiments, boron (B) may be used. In embodiments, relatively high implant dose and/or relatively high ion implantation energy may be used. In embodiments, second well region 120 may be a P-body.

According to embodiments, first ion-implanted region 140 may have a relatively shallow depth, and/or may be formed at a portion of an upper side of second well region 120. In embodiments, ions of a first conductivity type may be implanted including a relatively lower implant dose and/or relatively lower ion implantation energy than for second well region 120. In embodiments, a photoresist pattern on and/or over third isolation layer 136 may extend up to a portion of first ion-implanted region 140. In embodiments, second ion-implanted region 150 may be formed at a remaining portion of first ion-implanted region 140, for example by implanting ions of a second conductivity type. In embodiments, arsenic (As) may be used. In embodiments, third ion-implanted region 170 may be formed on and/or over first well region 110 between first isolation layer 132 and second isolation layer 134. In embodiments, second ion-implanted region 150 may be a source region, and/or third ion-implanted region 170 may be a drain region.

According to embodiments, a photoresist pattern may be removed, and/or a thermal treatment may be performed. In embodiments, a difference of diffusitivity between ions of a first conductivity type and ions of a second conductivity type may be present. In embodiments, second well region 120 may be relatively widely diffused, and/or second ion-implanted region 150 may be relatively slightly diffused. In embodiments, a portion of second well region 120, where second ion-implanted region 150 may not be formed, may be formed up to first well region 160 where gate 182 may be formed. In embodiments, a portion of second well region 120 where second ion-implanted region 150 may not be formed may reference a channel region. In embodiments, a length of a channel region may be adjusted for example by regulating temperature and/or time of a thermal treatment. In embodiments, a punch-through breakdown phenomenon may be minimized for example by maximizing an implant dose of second well region 120.

According to embodiments, a photoresist pattern opening a channel region may be formed on and/or over a semiconductor substrate. In embodiments, a secondary ion implantation process may be performed. In embodiments, a secondary ion implantation process may be performed including relatively lower implant dose and/or relatively lower ion implantation energy than for second ion-implanted region 150. In embodiments, accumulation channel 160 may be formed on and/or over channel region of second well region 120. In embodiments, accumulation channel 160 may be formed having a relatively shallow depth compared with second ion-implanted region 150.

According to embodiments, a semiconductor device may be in an off-state, accumulation channel 160 may be substantially fully depleted, and/or substantially no current may flow. In embodiments, a semiconductor device may be in an on-state and/or a voltage may be applied to gate electrode 182. In embodiments, a depletion layer of accumulation channel 160 may be minimized, and/or a current path of accumulation channel 160 may be activated.

According to embodiments, a photoresist pattern may be removed. In embodiments, well regions 110 and 120 may be formed. In embodiments, ion-implanted regions 140, 150 and/or 170 and/or accumulation channel 160 may be formed. In embodiments, gate dielectric 184 and/or gate electrode 182 may be formed on and/or over accumulation channel 160, a well region between second isolation layer 134 and accumulation channel 160 and/or a portion of second isolation layer 134. In embodiments, spacers 186 may be formed at opposite sides of gate electrode 182.

According to embodiments, insulation layer 190 may be formed on and/or over a semiconductor substrate including gate electrode 182. In embodiments, contact holes may be formed on and/or over insulation layer 190, which may expose a portion of second ion-implanted region 150 and/or third ion-implanted region 170. In embodiments, contact holes may be filled with a metal layer to form contact plugs 192 and/or 194. In embodiments, source electrode 198 and/or drain electrode 196 may be formed, and/or may be connected to contact plugs 192 and/or 194, on and/or over insulation layer 190.

Referring to example FIG. 3, an operation of a semiconductor device in accordance with embodiments is illustrated. According to embodiments, a voltage may be applied to gate electrode 182. In embodiments, accumulation channel 160 may be activated to form a channel path indicated by dotted lines.

Referring to example FIG. 4, a graph illustrates breakdown voltage characteristics of a semiconductor device using an inversion layer and a semiconductor device in accordance with embodiments. When a second well region, for example 120 of FIG. 2 and/or 50 of FIG. 1, may be at approximately 0 V, a measurement line A may reference a semiconductor device in accordance with embodiments, and/or a measurement line B may reference a semiconductor device using a inversion channel. According to a semiconductor device in accordance with embodiments, on-resistance may be minimized, and/or electron mobility may be maximized. A leakage amount of a drain current may be maximized. When approximately −1 V is applied to second well region 120, as illustrated by measurement line C, a breakdown voltage characteristic such as a PN diode may be restored.

According to embodiments, electron mobility on and/or over a P-body may be maximized by implementing an accumulation channel structure, in contrast to a channel structure where a current flows through an inversion layer formed on and/or over a surface of a P-body when a voltage may be applied. In embodiments, on-resistance (Ron) may be a main parameter of a semiconductor device and/or may be minimized. In embodiments, current drivability may be maximized.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an epitaxial layer over a semiconductor substrate;
   forming a first well region within said epitaxial layer;
   forming a first isolation layer and a third isolation layer at opposite sides of said first well region;
   forming a second isolation layer within said first well region between said first and third isolation layers;
   forming a second well region within said first well region between said third isolation layer and said second isolation layer;
   forming a first ion-implanted region within said second well region;
   forming a second ion-implanted region between said first ion-implanted region and said second isolation layer;
   forming a third ion-implanted region between said second isolation layer and said first isolation layer;
   diffusing said second well region including said first and second ion-implanted regions using a thermal treatment; and
   forming an accumulation channel between said diffused second well region and a region where a gate is to be formed, wherein said accumulation channel is formed in a process comprising at least one of a lower implant dose and a lower ion implantation energy than for said second ion-implanted region.

2. The method of claim 1, comprising a laterally diffused metal oxide semiconductor device.

3. The method of claim 1, wherein said epitaxial layer comprises a first conductivity type.

4. The method of claim 1, wherein said first well region comprises a second conductivity type.

5. The method of claim 1, wherein said second well region is formed over said first well region adjacent to said third isolation layer.

6. The method of claim 1, wherein said second well region comprises a first conductivity and functions as a body of said first conductivity.

7. The method of claim 1, wherein at least one of said first ion-implanted region, second ion-implanted region and third ion-implanted region are formed in a process comprising at least one of a lower implant dose and a lower ion implantation energy than for said second well region.

8. The method of claim 1, wherein said first ion-implanted region comprises a first conductivity type.

9. The method of claim 1, wherein said second ion-implanted region and said third ion-implanted region comprise a second conductivity type.

10. The method of claim 1, wherein said accumulation channel is formed comprising a shallower depth than said second ion-implanted region.

11. The method of claim 1, comprising:
   forming a gate dielectric over said accumulation channel, said first well region between said second isolation layer and said accumulation channel, and said second isolation layer; and
   forming a gate electrode over said gate dielectric.

* * * * *